(12) United States Patent
Xiao et al.

(10) Patent No.: US 12,348,019 B2
(45) Date of Patent: Jul. 1, 2025

(54) WATERPROOF GATEWAY DEVICE

(71) Applicant: Huawei Technologies Co., Ltd., Shenzhen (CN)

(72) Inventors: Jianjun Xiao, Dongguan (CN); Bin Wang, Shenzhen (CN); Xiaojuan Zhu, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 702 days.

(21) Appl. No.: 17/635,647

(22) PCT Filed: Aug. 3, 2020

(86) PCT No.: PCT/CN2020/106608
§ 371 (c)(1),
(2) Date: Feb. 15, 2022

(87) PCT Pub. No.: WO2021/031835
PCT Pub. Date: Feb. 25, 2021

(65) Prior Publication Data
US 2022/0368119 A1 Nov. 17, 2022

(30) Foreign Application Priority Data
Aug. 16, 2019 (CN) .......................... 201910759097.7

(51) Int. Cl.
*H02G 3/08* (2006.01)
*H04L 12/66* (2006.01)
(Continued)

(52) U.S. Cl.
CPC ............. *H02G 3/088* (2013.01); *H04L 12/66* (2013.01); *H05K 5/0247* (2013.01); *H05K 5/03* (2013.01); *H01R 13/5221* (2013.01)

(58) Field of Classification Search
CPC .......... H02G 3/088; H04L 12/66; H05K 5/03
See application file for complete search history.

(56) References Cited

U.S. PATENT DOCUMENTS

| 2,639,313 | A | * | 5/1953 | Street, Jr. | ................ | H01F 27/04 |
| | | | | | | 277/606 |
| 3,187,292 | A | * | 6/1965 | George | .............. | H01R 13/5202 |
| | | | | | | 439/275 |

(Continued)

FOREIGN PATENT DOCUMENTS

| CN | 2847590 Y | 12/2006 |
| CN | 101304136 A | 11/2008 |

(Continued)

*Primary Examiner* — Neil Abrams
(74) *Attorney, Agent, or Firm* — Leydig, Voit & Mayer, Ltd.

(57) ABSTRACT

This application provides a gateway device. The gateway device may include a base and a cable waterproof structure disposed on the base, the base includes at least one network interface, and the cable waterproof structure includes a cable plugged into the network interface and a cover that covers the network interface. The cable includes a cable body and a network interface plug fastened to an end portion of the cable body. A sealing member is disposed at a joint between the cable body and the network interface plug. A threading hole through which the cable is threaded is disposed in the cover, and the sealing member is attached to the threading hole through interference fit. Effective waterproof for the cable can be implemented through interference fit between the sealing member and the threading hole of the cover.

19 Claims, 11 Drawing Sheets

(51) Int. Cl.
H05K 5/02 (2006.01)
H05K 5/03 (2006.01)
*H01R 13/52* (2006.01)

(56) References Cited

U.S. PATENT DOCUMENTS

| | | | | |
|---|---|---|---|---|
| 3,783,436 | A * | 1/1974 | Bury | H01R 13/743 |
| | | | | 439/470 |
| 6,814,617 | B2 * | 11/2004 | Oota | H01R 13/5205 |
| | | | | 439/589 |
| 7,118,415 | B2 * | 10/2006 | Konda | H01R 13/648 |
| | | | | 439/926 |
| 7,249,972 | B2 | 7/2007 | Ohki et al. | |
| 7,641,501 | B2 * | 1/2010 | Uchikawa | H01R 13/6395 |
| | | | | 439/362 |
| 8,519,279 | B2 * | 8/2013 | Chang | H01R 13/5202 |
| | | | | 174/559 |
| 8,979,554 | B2 * | 3/2015 | Yudate | H01R 13/5202 |
| | | | | 439/732 |
| 8,992,249 | B2 * | 3/2015 | Kobayashi | H01R 13/6581 |
| | | | | 439/564 |
| 9,140,858 | B2 * | 9/2015 | Xiong | G02B 6/3888 |
| 9,270,048 | B2 * | 2/2016 | Harwath | H01R 13/52 |
| 9,574,001 | B2 * | 2/2017 | Wisniewski | C07K 16/2848 |
| 9,825,398 | B1 * | 11/2017 | Uchida | G04G 99/00 |
| 9,960,521 | B2 * | 5/2018 | Armstrong | H01R 13/516 |
| 10,128,608 | B2 * | 11/2018 | Kasar | H01R 24/28 |
| 10,199,765 | B2 * | 2/2019 | Gao | H01R 13/639 |
| 11,927,285 | B2 * | 3/2024 | Lips | F16L 3/222 |
| 11,966,094 | B2 * | 4/2024 | Ghammam | H02G 15/013 |
| 12,095,244 | B2 * | 9/2024 | Vastmans | G02B 6/4444 |
| 2005/0215101 | A1 | 9/2005 | Pepe | |
| 2011/0181002 | A1 | 7/2011 | Fujita et al. | |
| 2014/0314381 | A1 | 10/2014 | Adams et al. | |
| 2018/0175550 | A1 | 6/2018 | Baumgärtner et al. | |
| 2018/0231148 | A1 | 8/2018 | Homem et al. | |
| 2019/0319443 | A1 * | 10/2019 | Claessens | H02G 3/088 |
| 2022/0368119 | A1 * | 11/2022 | Xiao | H02G 15/013 |

FOREIGN PATENT DOCUMENTS

| | | |
|---|---|---|
| CN | 201289930 Y | 8/2009 |
| CN | 202616506 U | 12/2012 |
| CN | 203300874 U | 11/2013 |
| CN | 205070013 U | 3/2016 |
| CN | 205452665 U | 8/2016 |
| CN | 206471580 U | 9/2017 |
| CN | 206471585 U | 9/2017 |
| CN | 207542495 U | 6/2018 |
| CN | 208127519 U | 11/2018 |
| CN | 110635303 A | 12/2019 |
| EP | 0615662 A1 | 9/1994 |
| JP | H0633107 U | 4/1994 |
| JP | H10241782 A | 9/1998 |
| JP | 2007194028 A | 8/2007 |
| JP | 2010086766 A | 4/2010 |
| JP | 2011159626 A | 8/2011 |

\* cited by examiner

WATERPROOF GATEWAY DEVICE

CROSS-REFERENCE TO RELATED APPLICATIONS

This application is a National Stage of International Application No. PCT/CN2020/106608 filed on Aug. 3, 2020, which claims priority to Chinese Patent Application No. 201910759097.7 filed on Aug. 16, 2019. Both of the aforementioned applications are hereby incorporated by reference in their entireties.

TECHNICAL FIELD

Embodiments of this application relate to the field of device technologies, and in particular, to a gateway device.

BACKGROUND

To meet a user requirement, some gateway devices are currently disposed outdoor for use. For an outdoor gateway device, especially for a gateway device in a relatively harsh environment (for example, an environment of −40° C. to 80° C.), there is a relatively high requirement for waterproof for the outdoor gateway device, especially for waterproof for a cable with a network interface plug.

In the conventional technology, to implement waterproof for an outdoor gateway device, a cable waterproof structure is usually disposed outside a body of the outdoor gateway device. However, in this disposition manner, manufacturing costs of the gateway device are improved, and further an appearance effect of the gateway device is affected, causing relatively complex installation/removal.

SUMMARY

This application provides a gateway device. The gateway device mainly includes a base and a cable waterproof structure disposed on the base. When connection between the cable waterproof structure and the base is implemented, at least one network interface is disposed in the base, the cable waterproof structure has a cable that can be plugged into the network interface and a cover that covers the network interface, and the cover may be buckled to the base, or fastened to the base by using a fastener. When the cable is specifically disposed, the cable mainly includes a cable body and a network interface plug, the cable body may be fastened to the network interface plug in a welding manner or a snapping manner, and a sealing member may be further disposed at a joint between the cable body and the network interface plug. In addition, a threading hole through which the cable is threaded is disposed in the cover, and the sealing member is attached to the threading hole through interference fit, to implement effective waterproof for the cable.

In a possible implementation of this application, the sealing member is connected to end surfaces of the cable body and the network interface plug through fastening, and a connection manner thereof may be that the sealing member is bonded to the end surfaces of the cable body and the network interface plug by using an adhesive, or the sealing member is directly formed at the joint between the cable body and the network interface plug through injection molding by using an injection molding process, so that a liquid, dust, or the like can be prevented from entering the joint between the cable body and the network interface plug, thereby effectively improving waterproof and dustproof effects.

In a possible implementation of this application, a cross-sectional area of an end that is of the sealing member and that is close to the network interface plug may be greater than a cross-sectional area of an end that is of the sealing member and that is far away from the network interface plug, to facilitate threading of the sealing member into the threading hole.

In addition, alternatively, the sealing member may be disposed as a hard sealing member, and a flexible sealing layer is disposed on a hole wall of the threading hole of the cover. In this way, when the sealing member is attached to the threading hole through interference fit, the sealing member can closely fit with the flexible sealing layer, thereby helping improve a waterproof effect for the cable.

In a possible implementation of this application, limiting structures may be further disposed in the network interface plug and the network interface of the base. For example, a first limiting structure is disposed at an end that is of the network interface plug and that is connected to the cable body, and a second limiting structure is disposed at a corresponding position on the base. When the network interface plug is plugged into the network interface, the first limiting structure can be abutted against the second limiting structure for limiting, to limit axial movement of the network interface plug toward the inside of the base, and provide a support function for assembly of the cable with the cover. It may be understood that the first limiting structure and the second limiting structure may be but are not limited to protruded structures.

This application further provides a gateway device. The gateway device mainly includes a base and a cable waterproof structure disposed on the base. When connection between the cable waterproof structure and the base is implemented, at least one network interface is disposed in the base, the cable waterproof structure has a cable that can be plugged into the network interface and a cover that covers the network interface, and the cover may be buckled to the base, or fastened to the base by using a fastener.

When the cable is specifically disposed, the cable mainly includes a cable body and a network interface plug, the cable body may be fastened to the network interface plug in a welding manner or a snapping manner, a sealing member may be further disposed at a joint between the cable body and the network interface plug, and the sealing member may be a flexible sealing member or a hard sealing member.

When the cover is specifically disposed, the cover includes a cover body, and a first hard structure gasket, a flexible structure gasket, and a second hard structure gasket that are sequentially disposed in the cover body, an accommodating groove is disposed in the cover body, and the first hard structure gasket, the flexible structure gasket, and the second hard structure gasket are accommodated in the accommodating groove. In addition, a first threading hole is disposed in the first hard structure gasket, a second threading hole is disposed in the flexible structure gasket, a third threading hole is disposed in the second hard structure gasket, and a fourth threading hole is disposed in the cover body. Hole centers of the first threading hole, the second threading hole, the third threading hole, and the fourth threading hole correspond to each other, so that the cable body can be sequentially threaded through the threading holes. In addition, a cross-sectional area of an end that is of the sealing member and that is close to the network interface plug may be greater than a cross-sectional area of an end that is of the sealing member and that is far away from the network interface plug, to facilitate threading of the sealing member into the threading holes.

In addition, a half slot may be further disposed in the flexible structure gasket, and a side rib is disposed around the flexible structure gasket. In this way, the half slot of the flexible structure gasket can be opened to accommodate the cable body in the second threading hole. When the first hard structure gasket, the flexible structure gasket, and the second hard structure gasket are installed into the accommodating groove of the cover body after being fastened through locking by using a fastener, the side rib of the flexible structure gasket can squeeze an inner wall of the accommodating groove of the cover body through fitting, to close the half slot in the flexible structure gasket, so that sealing of the cover can be implemented.

In a possible implementation of this application, limiting structures may be further disposed in the network interface plug and the network interface of the base. For example, a first limiting structure is disposed at an end that is of the network interface plug and that is connected to the cable body, and a second limiting structure is disposed at a corresponding position on the base. When the network interface plug is plugged into the network interface, the first limiting structure can be abutted against the second limiting structure for limiting, to limit axial movement of the network interface plug toward the inside of the base, and provide a support function for assembly of the cable with the cover. It may be understood that the first limiting structure and the second limiting structure may be but are not limited to protruded structures.

This application further provides a gateway device. The gateway device mainly includes a base and a cable waterproof structure disposed on the base. When connection between the cable waterproof structure and the base is implemented, at least one network interface is disposed in the base, the cable waterproof structure has a cable that can be plugged into the network interface and a cover that covers the network interface, and the cover may be buckled to the base, or fastened to the base by using a fastener.

When the cable is specifically disposed, the cable mainly includes a cable body and a network interface plug, the cable body may be fastened to the network interface plug in a welding manner or a snapping manner, a sealing member may be further disposed at a joint between the cable body and the network interface plug, and the sealing member may be a flexible sealing member or a hard sealing member. In addition, a cross-sectional area of an end that is of the sealing member and that is close to the network interface plug may be greater than a cross-sectional area of an end that is of the sealing member and that is far away from the network interface plug, to facilitate threading of the sealing member into a threading hole.

When the cover is specifically disposed, the cover mainly includes a cover body, a first clamping cover, and a second clamping cover. The threading hole through which the network interface plug can be threaded is disposed in the cover body, and an accommodating groove is disposed in the cover body. The first clamping cover and the second clamping cover may be accommodated in the accommodating groove after being aligned and combined, and the first clamping cover and the second clamping cover may be clamped onto the cable through aligning and combination. To implement a good sealing effect, a waterproof gasket may be disposed on a side that is of the first clamping cover and that fits with the cable, a waterproof gasket may be disposed on a side that is of the second clamping cover and that fits with the cable, or waterproof gaskets may be disposed on both the first clamping cover and the second clamping cover.

REFERENCE NUMERALS

1—housing; 2—cable gland; 3—grooved joint; 4—rubber lining; 5—hex nut; 6—upper metal cover; and 7—lower metal cover;

8—upper rubber strip; 9—lower rubber strip; 10—cable trough; 11—base; 111—network interface; 112—second limiting structure; and 12—router;

13—antenna box; 14—cable; 141—cable body; 142—network interface plug; 143—sealing member; and 144—first limiting structure;

15—cover; 151—buckle; 152—cover body; 153—threading hole; and 154—flexible sealing structure;
155—first hard structure gasket; 156—second hard structure gasket; 157—flexible structure gasket; and 1571—side rib;
1572—half slot; 158—first threading hole; 159—second threading hole; 1510—third threading hole; and 1511—first clamping cover; and
1512—second clamping cover; 1513—accommodating groove; 1514—waterproof gasket; and 16—screw.

DESCRIPTION OF EMBODIMENTS

To make objectives, technical solutions, and advantages of this application more clearly, the following further describes this application in detail with reference to the accompanying drawings.

Figure 1:
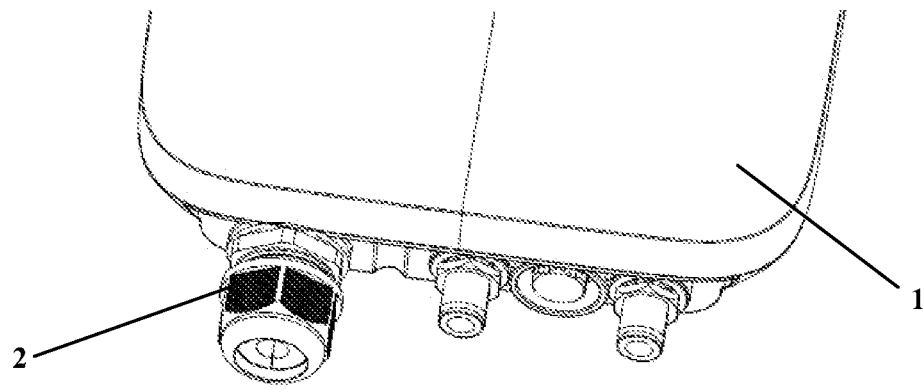
FIG. 1 is a schematic diagram of a partial structure of a gateway device according to an existing embodiment.
Figure 2:
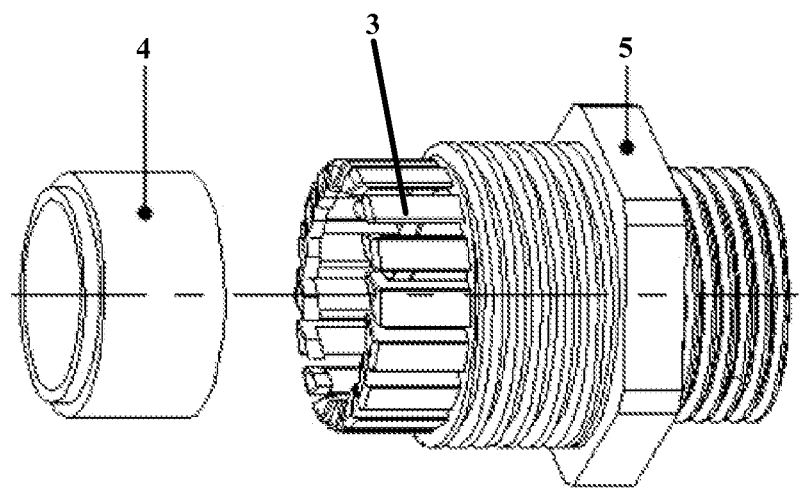
FIG. 2 is a schematic diagram of an exploded structure of cable gland.

An outdoor gateway device, such as outdoor customer premises equipment (CPE), is a mobile signal access device that can be disposed outdoor and that can receive a mobile signal and forward the mobile signal by using a wireless WIFI signal. Cable waterproof is very important for the outdoor gateway device. Currently, to implement cable waterproof for the outdoor gateway device, a person skilled in the art proposes a plurality of solutions. FIG. 1 is a schematic diagram of a partial structure of an outdoor gateway device that has a cable waterproof structure. The gateway device includes a housing 1 and cable gland 2 disposed on the housing 1. The housing 1 has a plurality of network interfaces (not shown in the figure). The cable gland 2 is correspondingly disposed in the network interface of the gateway device. Referring to FIG. 2, the cable gland 2 includes a grooved joint 3 fastened to the network interface, a rubber lining 4 disposed inside the grooved joint 3, and a hex nut 5 sleeved onto the outside of the grooved joint 3. The gateway device further includes a cable (not shown in the figure). When the cable is connected to the gateway device, referring to FIG. 1 and FIG. 2 together, the cable may be first threaded into the network interface by using the cable gland 2, and then the hex nut 5 of the cable gland 2 is tightened through rotating. In a process of tightening the hex nut 5 through rotating, the grooved joint 3 squeezes the rubber lining 4 to lock the cable, thereby implementing fastening and sealing of the cable. When fastening and sealing of the cable are implemented in the manner shown in FIG. 1 and FIG. 2, because the hex nut 5 of the cable gland 2 needs to be rotated, if the cable is a cable with a non-circular cross-section, such as a flat cable, during rotation of the hex nut 5, the cable is very likely to rotate, and even the cable is damaged in a serious case. Therefore, the manner is inapplicable to a cable with a non-circular cross-section and has a relatively small applicable range. In addition, a size of the cable gland 2 is relatively large. This affects an appearance effect of the gateway device. In addition, installation/removal of the cable is implemented by using only the cable gland 2. When the gateway device needs to be maintained, the housing 1 of the gateway device still needs to be additionally opened. Therefore, maintenance of the gateway device is relatively inconvenient.

Figure 3:
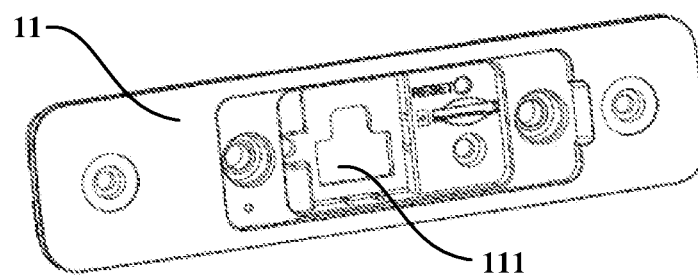
FIG. 3 is a schematic diagram of a structure of a base according to an embodiment of this application.
Figure 4:
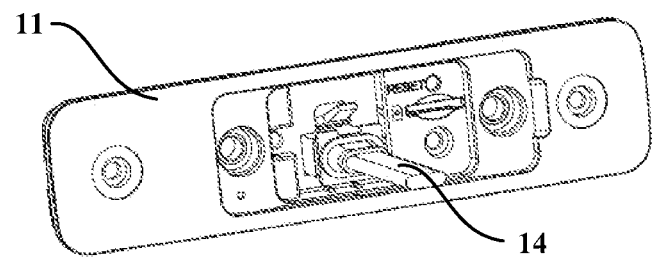
FIG. 4 is a schematic diagram of a structure of a base according to another embodiment of this application.
Figure 5:
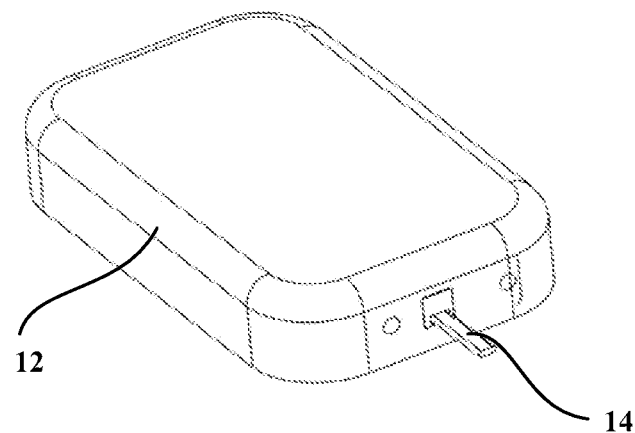
FIG. 5 is a schematic diagram of a structure of a router according to an embodiment of this application.
Figure 6:
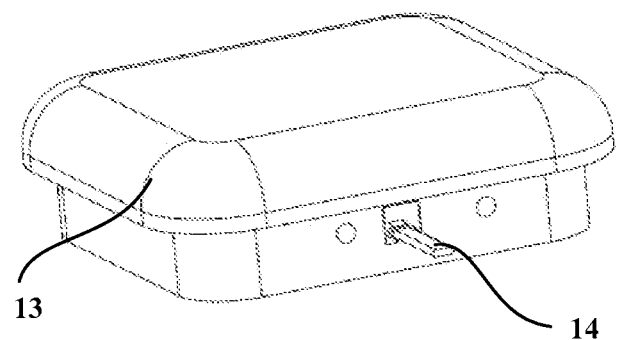
FIG. 6 is a schematic diagram of a structure of an antenna box according to an embodiment of this application.

Based on this, an embodiment of this application provides a cable waterproof structure. The cable waterproof structure may be but is not limited to being applied to bases 11 of base walls shown in FIG. 3 and FIG. 4, or a gateway device such as a router 12 shown in FIG. 5 or an antenna box 13 shown in FIG. 6. It may be understood that, regardless of a type of a gateway device, the gateway device includes at least one network interface into which the cable 14 can be plugged.

The cable waterproof structure can implement axial reliable waterproof for cables with a plurality of types of cross-sectional shapes (such as a flat cable or a circular cable). In addition, the cable can be conveniently installed and removed, so that a requirement of a user for rapid installation/removal and maintenance on site can be met. The cable waterproof structure provided in this embodiment of this application is described below in detail with reference to the accompanying drawings by using an example in which the cable waterproof structure is applied to the bases 11 of the base walls shown in FIG. 3 and FIG. 4.

Figure 7:
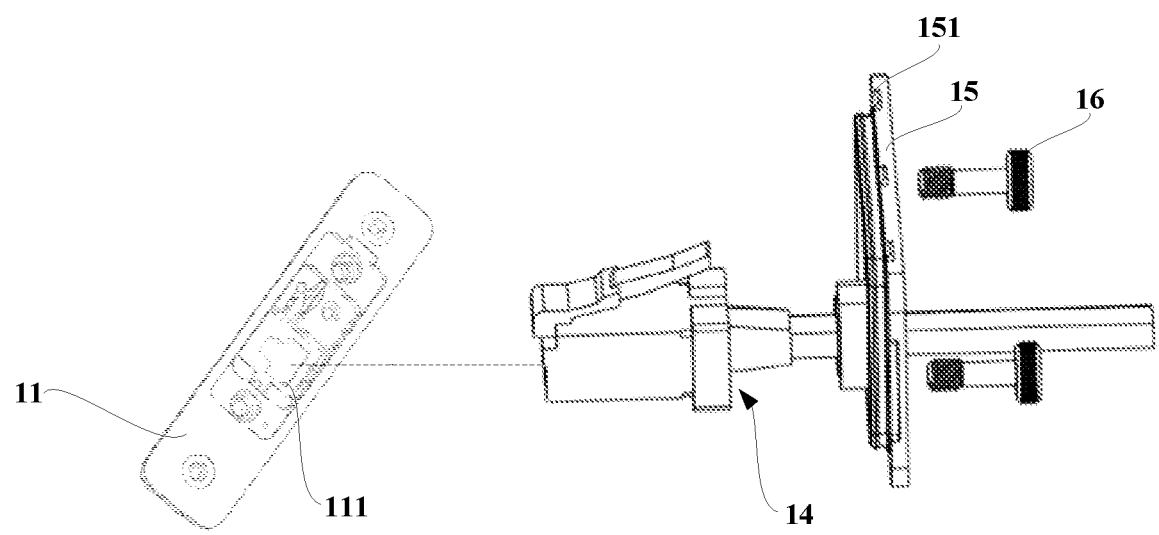
FIG. 7 is a schematic diagram of a structure of assembling a base, a cable, and a cover according to an embodiment of this application.

Referring to FIG. 7, an embodiment of this application provides a cable waterproof structure. The cable waterproof structure may include a cable 14 plug-connected to a network interface 111 of a base 11 through matching and a cover 15 that covers the network interface 111. A buckle 151 may be disposed on the cover 15. In this case, a buckling port (not shown in the figure) may be disposed at a corresponding position on the base 11. In this way, the cover 15 can be buckled to the base 11 by using the buckle 151. In addition, the cover 15 may be further fastened to the base 11 by using a fastener such as a screw 16, to increase reliability of connection between the cover 15 and the base 11.

Figure 8:
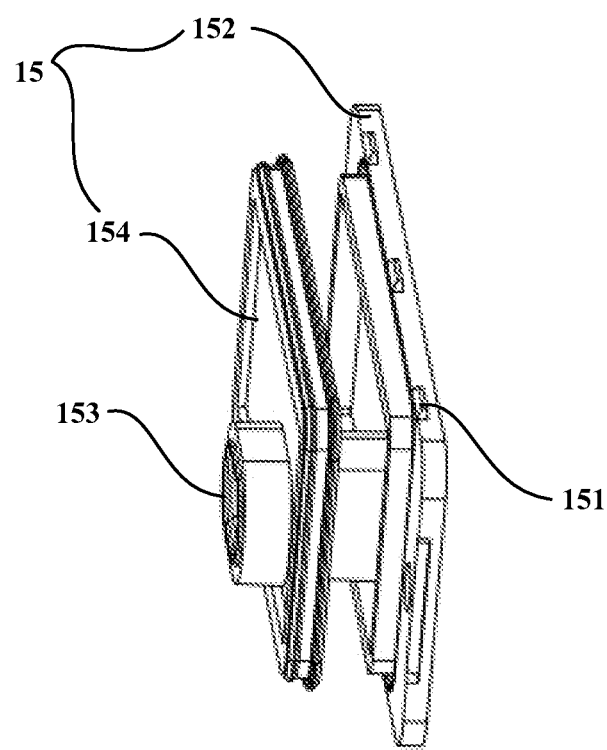
FIG. 8 is a schematic diagram of an exploded structure of a cover according to an embodiment of this application.

To implement effective waterproof for the cable 14, when the cover 15 is specifically disposed, referring to FIG. 8, the cover 15 includes a cover body 152, and a threading hole 153 disposed in the cover body 152. In FIG. 8, a flexible sealing structure 154 is disposed on the cover body 152, and the flexible sealing structure 154 may be simultaneously formed as a flexible sealing layer 155 (this is not shown in FIG. 8 and reference can be made to FIG. 10) on an inner wall of the threading hole 153. Referring to FIG. 8, when the cover 15 is specifically formed, especially when the flexible sealing structure 154 is formed on the cover body 152, a plurality of processing technologies may be used. In a possible implementation of this application, in a liquid injection molding (LIM) process, a quantification apparatus may be used to control two materials to be formed as an integral structure product through injection molding in a specific proportion. Therefore, plastic and silica gel may be but are not limited to being integrally processed into the cover 15 by using the LIM process. The plastic may be used to form the cover body 152 of the cover 15, and the silica gel is formed on the cover body 152 and can be used to form the flexible sealing layer 155 (this is not shown in FIG. 8 and reference can be made to FIG. 10) on the inner wall of the threading hole 153. It may be understood that the disposition manner of the cover 15 is merely an example description of the cover 15 in this application. In addition, when the flexible sealing layer on the inner wall of the threading hole 153 is specifically disposed, the flexible sealing layer on the inner wall of the threading hole 153 may be alternatively a flexible material film layer, such as a silica gel film, bonded to the threading hole 153.

Figure 9:
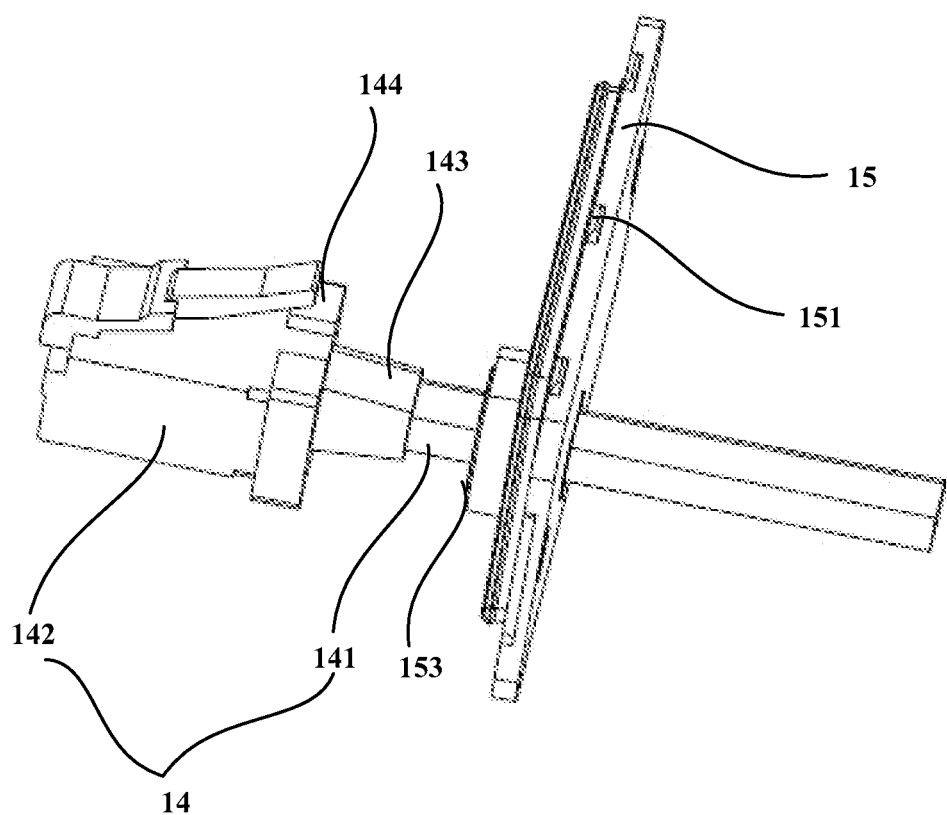
FIG. 9 is a schematic diagram of a structure of assembling a cable and a cover according to an embodiment of this application.

Referring to FIG. 9, when the cable 14 is threaded into the threading hole 153 of the cover 15, the flexible sealing layer on the inner side wall of the threading hole 153 may coat the cable 14. To implement effective waterproof for the cable 14, a structure that can closely fit with the flexible sealing layer further should be disposed on the cable 14. Still referring to FIG. 9, when the cable 14 is specifically disposed, the cable 14 includes a cable body 141 and a network interface plug 142 fastened to an end portion of the cable body 141. When the cable body 141 is specifically connected to the network interface plug 142, the connection may be implemented in a welding manner, a snapping manner, or the like. In addition, after the cable body 141 is connected to the network interface plug 142, a sealing member 143 may be further disposed at a joint between the cable body 141 and the network interface plug 142. In addition, the sealing member 143 may be further connected to end surfaces of the cable body 141 and the network interface plug 142 through fastening, to prevent entering of a liquid from a gap at the joint between the cable body 141 and the network interface plug 142, so that a waterproof effect for the cable 14 is improved, and the cable body 141 can be more securely connected to the network interface plug 142.

In the embodiment shown in FIG. 9, when the sealing member 143 is specifically disposed, the sealing member 143 may be disposed in a plurality of manners. For example, the sealing member 143 may be disposed as a hard sealing structure, to facilitate assembly of the hard sealing structure with the flexible sealing layer in the threading hole 153 of the cover 15. The hard sealing structure may be hard rubber formed through injection molding. In addition, a cross-sectional size of an end that is of the hard rubber and that is fastened to the network interface plug 142 may be greater than a cross-sectional size of an end that is of the hard rubber and that is far away from the network interface plug 142 (in the flowing, for ease of description, a structure in which a cross-sectional size of one end is greater than a cross-sectional size of the other end is referred to as a conical structure, for example, hard rubber in which a cross-sectional size of one end is greater than a cross-sectional size of the other end is referred to as conical hard rubber). This can further facilitate threading of the conical hard rubber into the threading hole 153 of the cover 15. In addition, a cross-section of the conical hard rubber may be circular, or of a same shape as a cross-section of the cable body 141 (for example, when the cable body 141 is a flat cable with a rectangular cross-section, the cross-section of the conical hard rubber may be rectangular). It may be understood that the foregoing description is merely an example description of the hard sealing structure. The hard sealing structure may be alternatively a hard sealing ring (for example, a plastic sealing ring) sleeved onto the cable body 141, or the like. The hard sealing ring may also be disposed as a conical hard sealing ring, and an end with a large cross-sectional size is abutted against an end surface of the network interface plug. In addition, after the hard sealing ring is sleeved onto the cable body 141, the hard sealing ring may be further fastened to the cable body 141 and the network interface plug 142 in a bonding manner or the like, to block the gap between the cable body 141 and the network interface plug 142, thereby improving waterproof and dustproof effects thereof.

Figure 10:
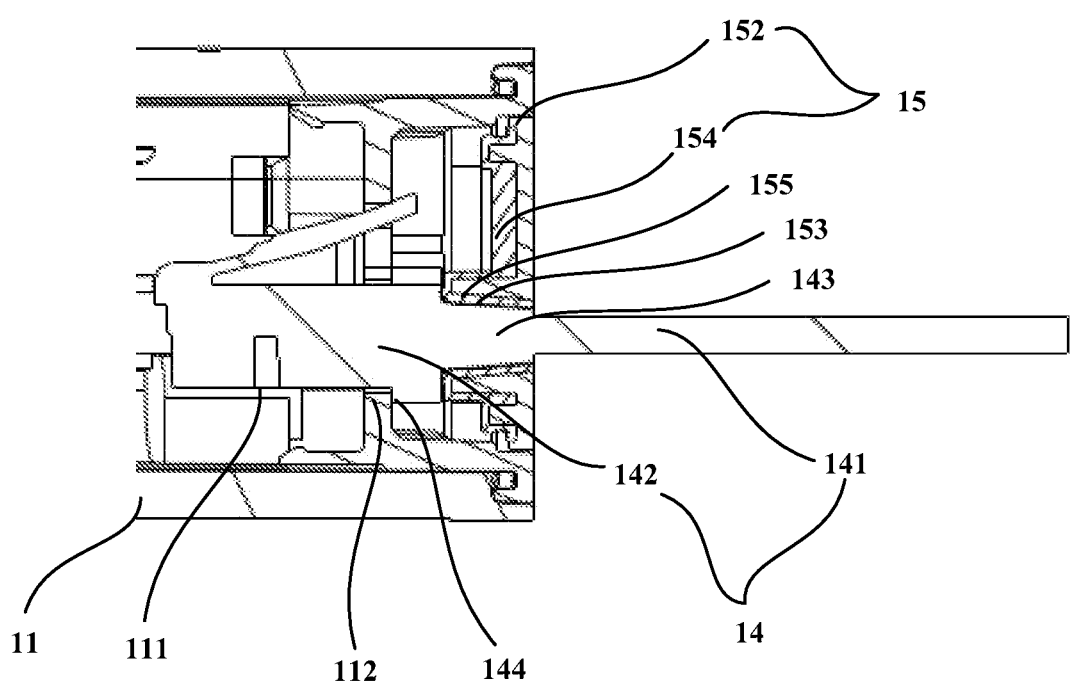
FIG. 10 is a cross-sectional view of an assembled structure of a cable, a cover, and a base according to an embodiment of this application.

FIG. 10 is a cross-sectional view in which the cable 14 and the cover 15 are installed on the base 11. When the network interface plug 142 is plug-connected to the network interface 111 of the base 11, limiting structures may be further disposed in the network interface plug 142 and the network interface 111 of the base 11. Specifically, a first limiting structure 144 may be disposed on the network interface plug 142. When the first limiting structure 144 is specifically disposed, the first limiting structure 144 may be a first protrusion disposed on an end that is of the network interface plug 142 and that is connected to the cable body 141, and the first protrusion may be fastened to the network interface plug 142 in a bonding manner or a buckling manner, or the first protrusion may be a structure integrally formed with the foregoing hard sealing structure by using one process. Certainly, it may be understood that the foregoing description is merely an example description of some possible structures of the first protrusion, and the first protrusion may be alternatively other structures that can support limiting. These structures are not listed one by one herein. Correspondingly, to limit axial movement of the network interface plug 142 toward the inside of the base 11, a second limiting structure 112 should be further disposed at a corresponding position on the base 11. When the second limiting structure 112 is specifically disposed, the second limiting structure 112 may be a second projection disposed inside the network interface 111 of the base 11.

To further understand a waterproof principle of the cable waterproof structure in this embodiment of this application, next, referring to FIG. 8 to FIG. 10, processing of the cover 15 and the cable 14 and assembling of the cable waterproof structure with a device are described by using an example in which the cover 15 is a structure formed by integrally processing plastic and silica gel by using the LIM process, the sealing member 143 is formed at the joint between the cable body 141 and the network interface plug 142, the first limiting structure 144 is formed on the network interface plug 142, and the second limiting structure 112 is disposed in the network interface 111 of the base 1.

First, referring to FIG. 8, the plastic and the silica gel are integrally processed into the cover 15 by using the LIM process, the cover 15 has the threading hole 153, and the silica gel is formed on the cover 15 and the hole wall of the threading hole 153 as the flexible sealing structure 154. Then, referring to FIG. 9, the cable body 141 is threaded through the threading hole 153, and the cable body 141 is fastened to the network interface plug 142 by using a welding process; and then, the sealing member 143 may be formed at the joint between the cable body 141 and the network interface plug 142 in a vertical injection molding manner, and simultaneously the first limiting structure 144 is formed on the network interface plug 142. The foregoing steps all can be completed in a cable factory. Finally, the cable 14 and the cover 15 that are assembled are transported to an installation site of a gateway device. During specific installation, referring to FIG. 10, the network interface plug 142 is plugged into the corresponding network interface 111 in the base 11 of the gateway device, and the first limiting structure 144 is abutted against the second limiting structure 112 in the network interface 111 of the base 11 for limiting; the cover 15 is moved along the cable body 141 to cover the network interface 111 and the cover 15 is buckled to the base 11 by using the buckle, and in this case, the sealing member 143 is attached to the flexible sealing layer 155 in the threading hole 153 through interference fit, to provide a waterproof function for the cable 14; and then, the cover 15 is fastened to the base 11 by using the screw. This completes installation of the cable 14 of the gateway device.

Still referring to FIG. 10, in the foregoing installation process, the first limiting structure 144 is abutted against the second limiting structure 112, so that in an installation process of the cover 15, a hard support function can be provided for the cover 15 to squeeze the sealing member 143, to facilitate installation of the cover 15. The installation process is relatively simple, and effective waterproof for the cable 14 can be implemented through interference fit between the sealing member 143 and the flexible sealing layer 155 (such as silica gel) in the threading hole 153 of the cover 15. When the gateway device needs to be maintained, the screw for fastening the cover 15 may be directly loosened through rotating, and the cover 15 may be directly removed, to implement plugging/unplugging of the network interface plug 142, thereby facilitating maintenance of the gateway device. In addition, in this technical solution, the cable waterproof structure formed between the hard sealing member 143 and the flexible sealing layer 155 is relatively simple, and has a relatively small size, so that an appearance effect of the gateway device can be relatively good.

Figure 11:
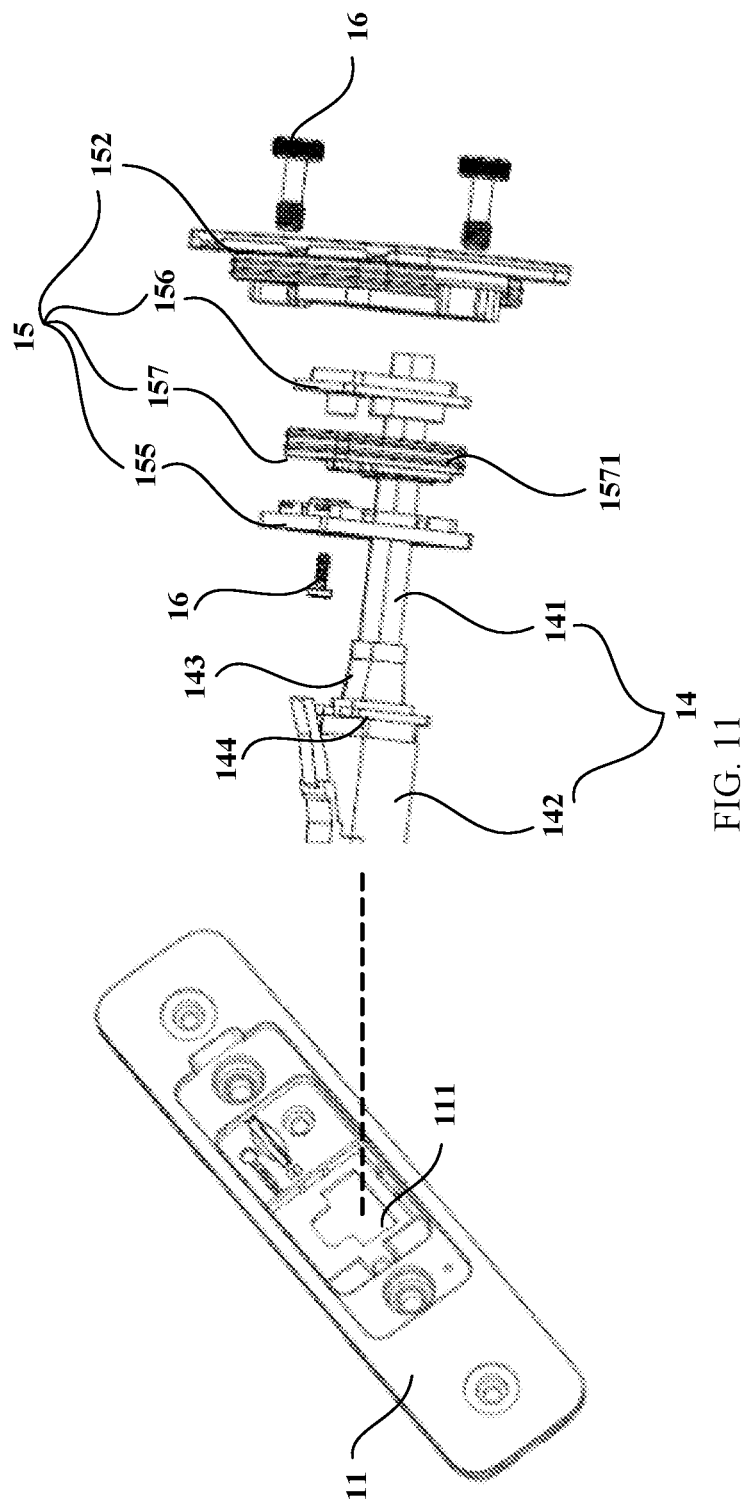
FIG. 11 is a schematic diagram of a structure of assembling a base, a cable, and a cover according to another embodiment of this application.

Referring to FIG. 11, another embodiment of this application provides a cable waterproof structure. The cable waterproof structure may include a cable 14 plug-connected to a network interface 111 through matching and a cover 15 that covers the network interface 111. In this embodiment, disposition manners of the cable 14 and a base 11 are the same as those in the foregoing embodiment. Details are not described herein again. However, a disposition manner of the cover 15 is greatly different from that in the foregoing embodiment.

Referring to FIG. 11, when the cover 15 is specifically disposed, the cover 15 includes a cover body 152, a first hard structure gasket 155, a flexible structure gasket 157, and a second hard structure gasket 156. A fourth threading hole and an accommodating groove (not shown in the figure) are disposed in the cover body 152. A buckle 151 may be further disposed on the cover body 152, and a buckling port (not shown in the figure) is disposed at a corresponding position on the base 11. In this way, the cover body 152 can be buckled to the base 11 by using the buckle 151. To improve reliability of connection between the cover body 152 and the base 11, the cover body 152 may be further fastened to the base 11 by using a fastener such as a screw 16. In addition, the first hard structure gasket 155 is disposed away from the cover body 152 relative to the second hard structure gasket 156. In another possible implementation of this application, the second hard structure gasket 156 may be omitted. In this embodiment, a fastening manner of the first hard structure gasket 155, the flexible structure gasket 157, and the second hard structure gasket 156 is not limited. For example, the first hard structure gasket 155, the flexible structure gasket 157, and the second hard structure gasket 156 may be locked by using a fastener such as a screw 16, or bonded by using an adhesive.

Figure 12:
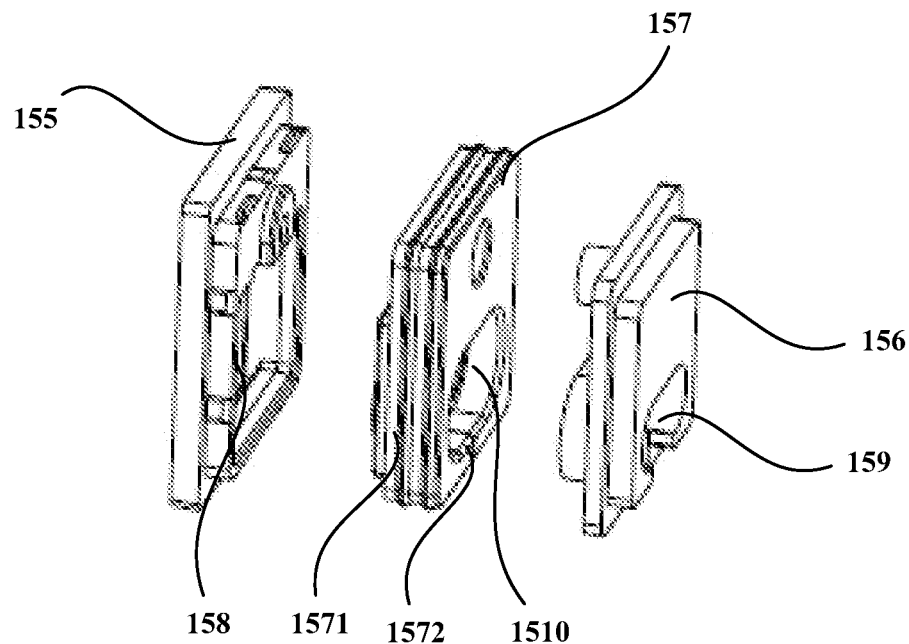
FIG. 12 is a schematic diagram of a position relationship between a first hard structure gasket, a second hard structure gasket, and a flexible structure gasket according to an embodiment of this application.
Figure 13:
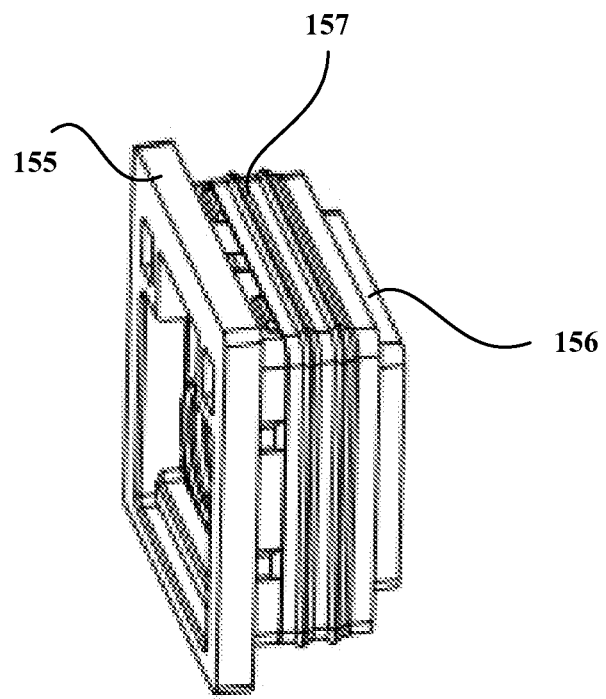
FIG. 13 is a schematic diagram of an assembled structure of a first hard structure gasket, a second hard structure gasket, and a flexible structure gasket according to an embodiment of this application.
Figure 14:
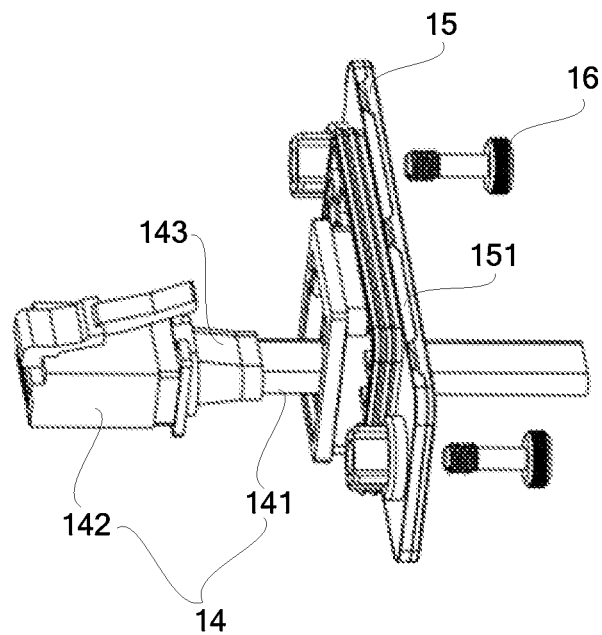
FIG. 14 is a schematic diagram of a structure of assembling a cable and a cover according to another embodiment of this application.

Referring to FIG. 12, after being sequentially fastened through fitting to form a structure shown in FIG. 13, the first hard structure gasket 155, the flexible structure gasket 157, and the second hard structure gasket 156 may be accommodated in the accommodating groove.

Referring to FIG. 12, when the first hard structure gasket 155 is specifically disposed, a first threading hole 158 is disposed in the first hard structure gasket 155, a second threading hole 1510 is disposed in the flexible structure gasket 157, and a third threading hole 159 is disposed in the second hard structure gasket 156. Hole centers of the first threading hole 158, the second threading hole 1510, and the third threading hole 159 correspond to each other. In addition, still referring to FIG. 12, a half slot 1572 may be further disposed in the flexible structure gasket 157, and a side rib 1571 is disposed around the flexible structure gasket 157.

To further understand a waterproof principle of a gateway device in this embodiment of this application, next, referring to FIG. 11 to FIG. 15, processing of the cover 15 and the cable 14 and assembling of the cable waterproof structure with the device are described by using an example.

Figure 15:
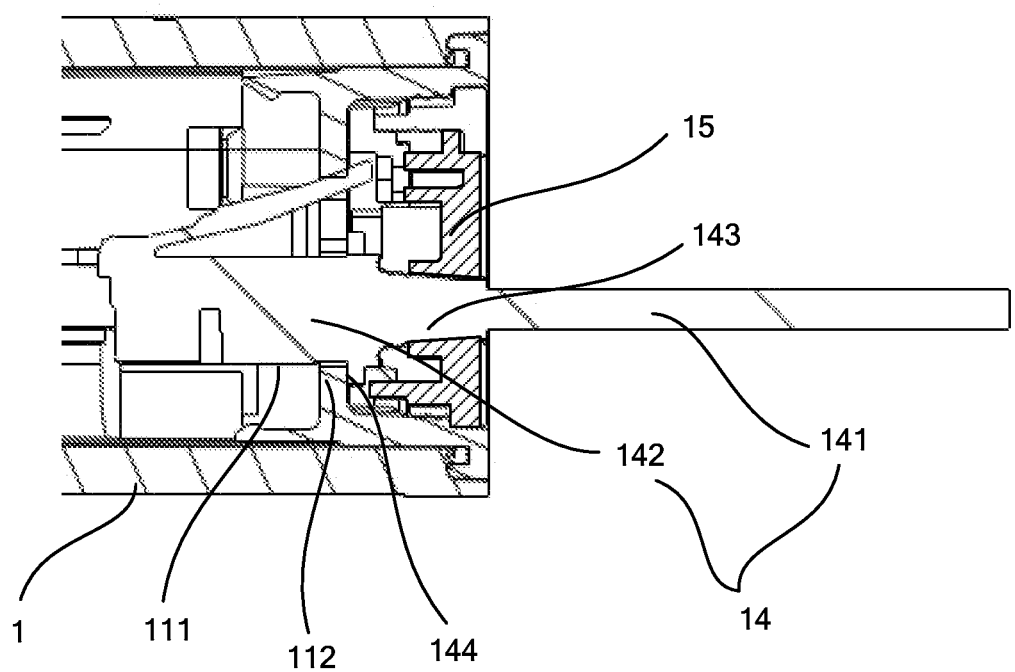
FIG. 15 is a cross-sectional view of an assembled structure of a cable, a cover, and a base according to another embodiment of this application.

Although the cable 14 and the base 11 of the gateway device in this embodiment are the same as those in the foregoing embodiment, an assembly process is still greatly different. In this embodiment, first, referring to FIG. 11, a sealing member 143 (conical hard rubber) is formed at a joint between a cable body 141 and a network interface plug 142 in a vertical injection molding manner or the like, and simultaneously a first limiting structure 144 is formed on the network interface plug 142. This forms the cable 14 in this embodiment. This step can be completed in a cable factory. Then, the cable 14 in the foregoing step may be transported to an assembly factory for assembly. Specifically, referring to FIG. 11 and FIG. 12 together, first, the network interface plug 142 is sequentially threaded through the fourth threading hole of the cover body 152 and the third threading hole 159 of the second hard structure gasket 156, then the half slot 1572 of the flexible structure gasket 157 is opened to thread the cable body 141 into the second threading hole 1510 of the flexible structure gasket 157, and finally the network interface plug 142 is threaded through the first threading hole 158 of the first hard structure gasket 155. Then, referring to FIG. 11, after being fastened through locking by using the fastener, to form the integral structure shown in FIG. 13, the first hard structure gasket 155, the flexible structure gasket 157, and the second hard structure gasket 156 may be installed into the accommodating groove of the cover body 152 to form the cover 15 shown in FIG. 14. In this case, the side rib 1571 of the flexible structure gasket 157 squeezes an inner wall of the accommodating groove of the cover body 152 through fitting, to close the half slot 1572 (refer to FIG. 12) in the flexible structure gasket 157, so that sealing of the cover 15 can be implemented. Finally, referring to FIG. 14, the cable 14 and the cover 15 that are assembled are transported to an installation site of a gateway device. During specific installation, refer to FIG. 15. FIG. 15 is a cross-sectional view in which the cable 14 and the cover 15 are installed on the base 11. The network interface plug 142 is plugged into the corresponding network interface 111 in the base 11, and the first limiting structure 144 of the network interface plug 142 is abutted against a second limiting structure 112 in the base 11 for limiting; the cover 15 is moved along the cable body 141 to cover the network interface 111 and the cover 15 is buckled to the base 11 by using the buckle, and in this case, the sealing member 143 is attached to the flexible structure gasket through interference fit, to provide a waterproof function for the cable 14; and then, the cover 15 is fastened to the base 11 of the gateway device by using the screw. This completes installation of the cable 14 of the gateway device.

In the foregoing installation process, the first limiting structure 144 is abutted against the second limiting structure 112, so that in an installation process of the cover 15, a hard support function can be provided for the cover 15 to squeeze the sealing member 143, to facilitate installation of the cover 15. The installation process is relatively simple, and effective waterproof for the cable 14 can be implemented through interference fit between the sealing member 143 and the second threading hole of the flexible structure gasket of the cover 15. When the gateway device needs to be maintained, the screw for fastening the cover 15 may be directly loosened through rotating, and the cover 15 may be directly removed, to implement plugging/unplugging of the network interface plug 142, thereby facilitating maintenance of the gateway device. In addition, in this technical solution, the cable waterproof structure formed between the hard sealing member 143 and the flexible structure gasket is relatively simple, and has a relatively small size, so that an appearance effect of the gateway device can be relatively good.

Figure 16:
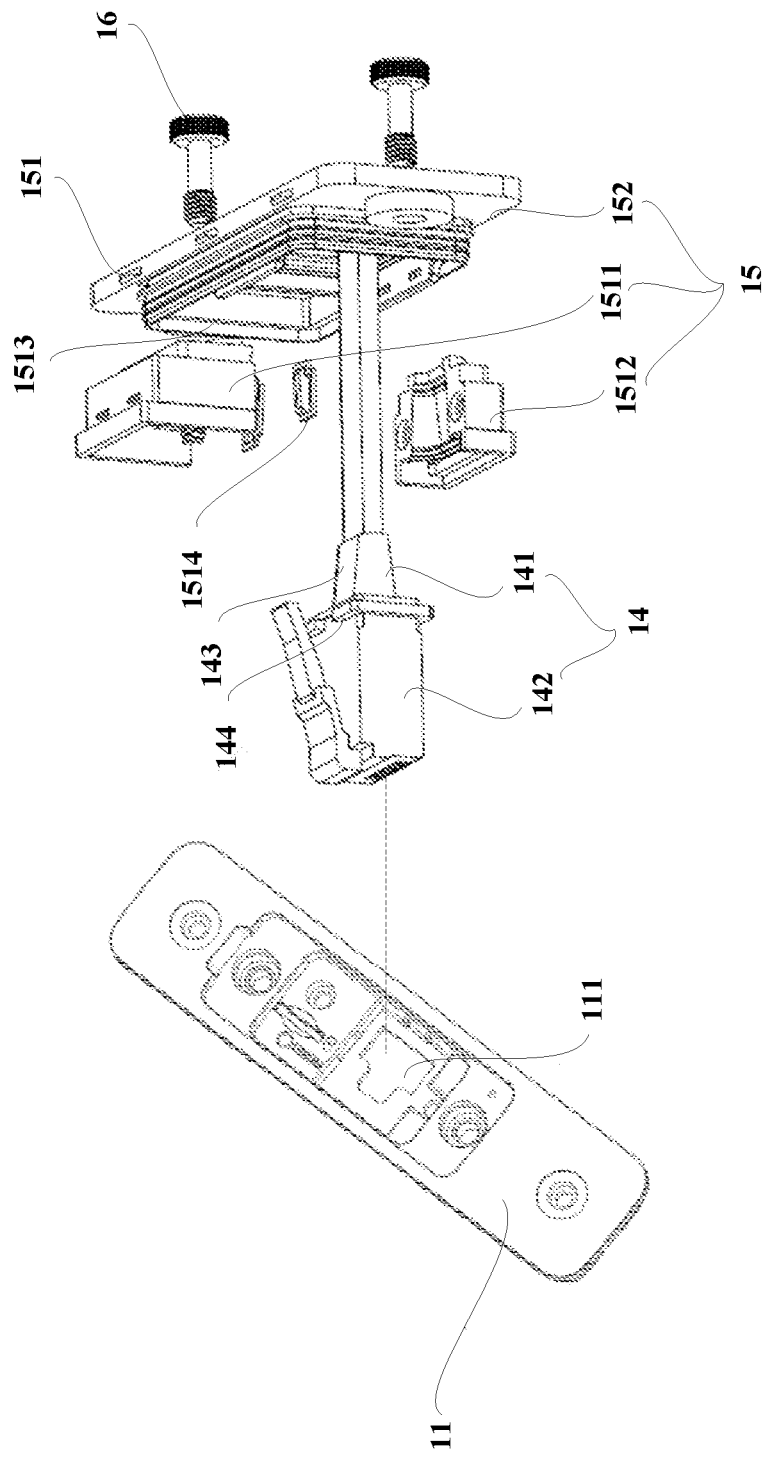
FIG. 16 is a schematic diagram of a structure of assembling a base, a cable, and a cover according to another embodiment of this application.

Referring to FIG. 16, another embodiment of this application provides a cable waterproof structure. The cable waterproof structure includes a cable 14 plug-connected to a network interface 111 of a base 11 through matching and a cover 15 that covers the network interface.

Still referring to FIG. 16, in this embodiment, when the cover 15 is specifically disposed, the cover 15 includes a cover body 152, a first clamping cover 1511, and a second clamping cover 1512. A threading hole through which a network interface plug 142 can be threaded is disposed in the cover body 152, and an accommodating groove 1513 is disposed in the cover body 152. The first clamping cover 1511 and the second clamping cover 1512 can be accommodated in the accommodating groove 1513 after being aligned and combined, and the first clamping cover 1511 and the second clamping cover 1512 can be clamped onto the cable 14 through aligning and combination, to form a combined-state structure shown in FIG. 17. In addition, still referring to FIG. 16, a waterproof gasket 1514 is disposed on a side that is of the first clamping cover 1511 and that fits with the cable 14, a waterproof gasket 1514 is disposed on a side that is of the second clamping cover 1512 and that fits with the cable 14, or waterproof gaskets 1514 are disposed on both the first clamping cover 1511 and the second clamping cover 1512. The waterproof gasket 1514 may be a flexible or hard waterproof adhesive. The first clamping cover 1511 and the second clamping cover 1512 may be locked by using a fastener such as a screw, so that a structure thereof is relatively reliable. Certainly, it may be understood that the disposition manner of the first clamping cover 1511 and the second clamping cover 1512 is only a possible implementation provided in this embodiment of this application. In addition, the first clamping cover 1511 and the second clamping cover 1512 may be formed as an integral structure. In this case, a through hole whose hole center corresponds to a hole center of the threading hole needs to be disposed in a clamping cover of the integral structure, so that the cable 14 can be threaded through the through hole. A buckle 151 may be disposed on the cover body 152, and a buckling port is disposed at a corresponding position on the base 11. In this way, the cover body 152 can be buckled to the base 11 by using the buckle 151. In addition, the cover body 152 may be further fastened to the base 11 by using a fastener such as a screw 16, to increase reliability of connection between the cover body 152 and the base 11.

Still referring to FIG. 16, when effective waterproof for the cable 14 is implemented by using the waterproof gasket, a structure that can closely fit with the waterproof gasket 1514 should also be further disposed on the cable 14. When the cable 14 is specifically disposed, the cable 14 includes a cable body 141 and a network interface plug 142 fastened to an end portion of the cable body 141. When the cable body 141 is specifically connected to the network interface plug 142, the connection may be implemented in a welding manner, a snapping manner, or the like. In addition, after the cable body 141 is connected to the network interface plug 142, a sealing member 143 may be further disposed at a joint between the cable body 141 and the network interface plug 142. In addition, the sealing member 143 may be further connected to end surfaces of the cable body 141 and the network interface plug 142 through fastening, to prevent entering of a liquid from a gap at the joint between the cable body 141 and the network interface plug 142, so that a waterproof effect for the cable 14 is improved, and the cable body 141 can be more securely connected to the network interface plug 142.

In the embodiment shown in FIG. 16, when the sealing member 143 is specifically disposed, the sealing member 143 may be disposed in a plurality of manners. For example, the sealing member 143 may be disposed as a flexible sealing structure, to facilitate sealing of the flexible sealing structure with the waterproof gasket 1514 of the cover 15. Referring to FIG. 16, the flexible sealing structure may be flexible rubber formed through injection molding. To closely fit the flexible rubber with the cover 15 during connection, the flexible rubber can be attached to the waterproof gasket 1514 through interference fit. In addition, a cross-sectional size of an end that is of the flexible rubber and that is fastened to the network interface plug 142 may be greater than a cross-sectional size of an end that is of the flexible rubber and that is far away from the network interface plug 142 (in the flowing, for ease of description, a structure in which a cross-sectional size of one end is greater than a cross-sectional size of the other end is referred to as a conical structure, for example, flexible rubber in which a cross-sectional size of one end is greater than a cross-sectional size of the other end is referred to as conical flexible rubber). This can further facilitate threading of the flexible rubber into a gap between the first clamping cover 1511 and the second clamping cover 1512. In addition, a cross-section of the flexible rubber may be circular, or of a same shape as a cross-section of the cable body 141 (for example, when the cable body 141 is a flat cable with a rectangular cross-section, the cross-section of the flexible rubber may be rectangular). It may be understood that the foregoing description is merely an example description of the flexible sealing structure. The flexible sealing structure may be alternatively a flexible sealing ring (for example, a silica gel sealing ring) sleeved onto the cable body 141, or the like. The flexible sealing ring may also be disposed as a conical flexible sealing ring, and an end with a large cross-sectional size is abutted against an end surface of the network interface plug. In addition, after the flexible sealing ring is sleeved onto the cable body 141, the flexible sealing ring may be further fastened to the cable body 141 and the network interface plug 142 in a bonding manner or the like, to block the gap between the cable body 141 and the network interface plug 142, thereby improving waterproof and dust-proof effects thereof.

Figure 18:
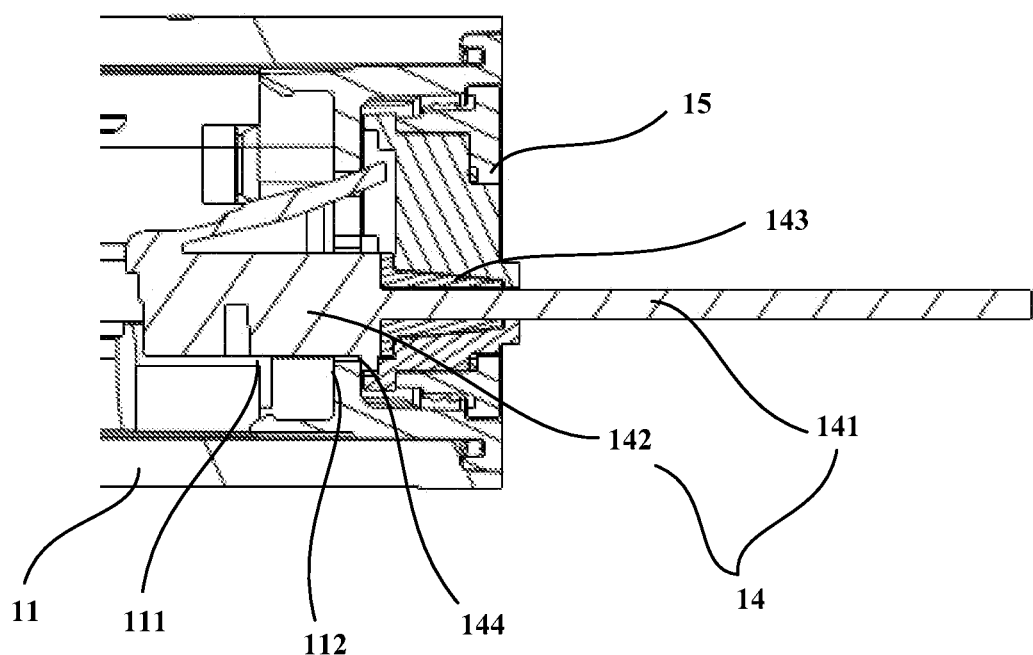
FIG. 18 is a cross-sectional view of an assembled structure of a cable, a cover, and a base wall according to another embodiment of this application.

Referring to FIG. 18, when the network interface plug 142 is plug-connected to the network interface 111 of the base 1, limiting structures may be further disposed in the network interface plug 142 and the network interface 111 of the base 1. Specifically, a first limiting structure 144 may be disposed on the network interface plug 142. When the first limiting structure 144 is specifically disposed, the first limiting structure 144 may be a first protrusion disposed on an end that is of the network interface plug 142 and that is connected to the cable body 141, and the first protrusion may be fastened to the network interface plug 142 in a bonding manner or a buckling manner, or the first protrusion may be a hard structure formed through injection molding. Certainly, it may be understood that the foregoing description is merely an example description of some possible structures of the first protrusion, and the first protrusion may be alternatively other structures that can support limiting. These structures are not listed one by one herein. Correspondingly, a second limiting structure 112 is disposed at a corresponding position on the base 11, to limit axial movement of the network interface plug 142 toward the inside of the base 1. When the second limiting structure 112 is specifically disposed, the second limiting structure 112 may be a second projection disposed inside the network interface 111 of the base 11.

Figure 17:
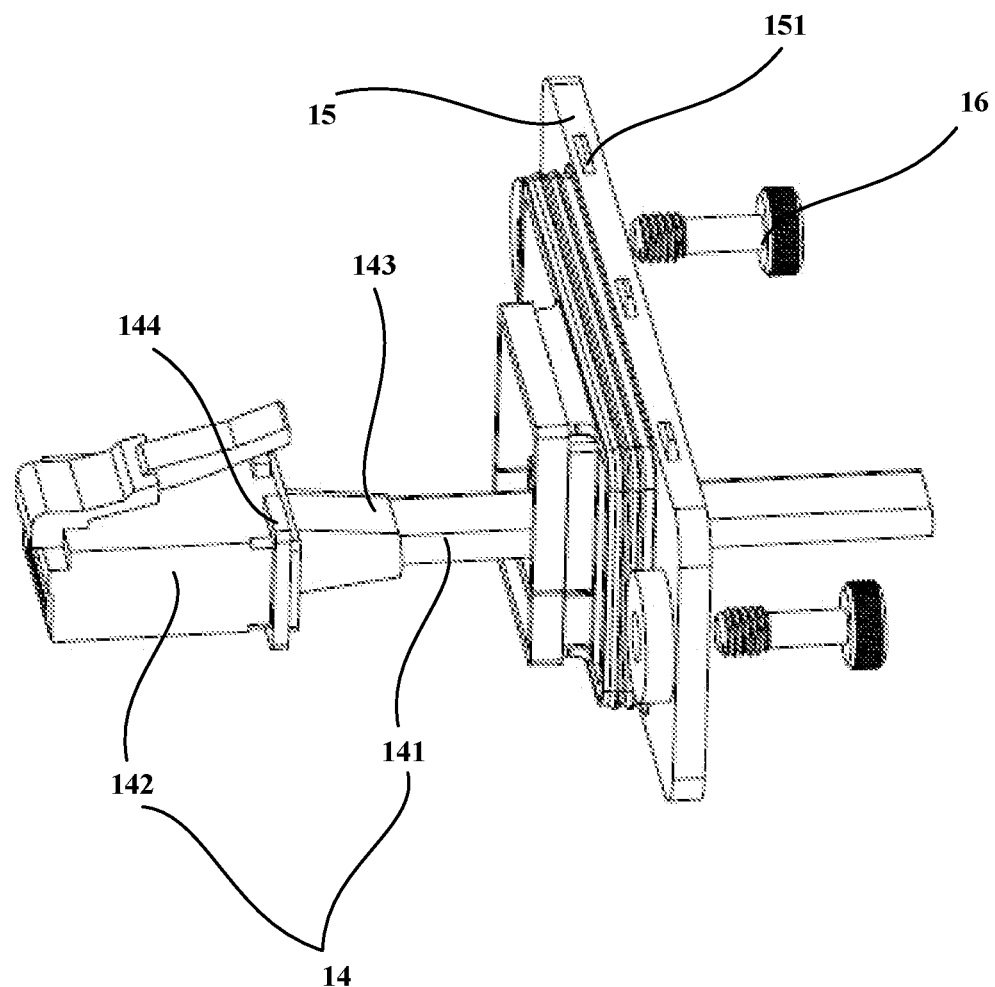
FIG. 17 is a schematic diagram of a structure of assembling a cable and a cover according to another embodiment of this application.

To further understand a waterproof principle of a gateway device in this embodiment of this application, next, referring to FIG. 16 to FIG. 18, processing of the cover 15 and the cable 14 and assembling of the cable 14 with the device are described by using an example.

First, referring to FIG. 16, the cable body 141 is fastened to the network interface plug 142 by using a welding process; and then, the sealing member 143 (conical flexible rubber) may be formed at the joint between the cable body 141 and the network interface plug 142 in a vertical injection molding manner or the like, and the first limiting structure 144 is formed on the network interface plug 142. This forms the cable 14 in this embodiment. This step can be completed in a cable factory. Then, the cable 14 formed in the foregoing step may be transported to an assembly factory for assembly. Specifically, referring to FIG. 16, the cable plug 142 is threaded through the threading hole of the cover body 151, and the first clamping cover 1511 with a waterproof gasket 1514 and the second clamping cover 1512 with a waterproof gasket 1514 are clamped onto the cable body 141 through aligning and combination (when the first clamping cover 1511 and the second clamping cover 1512 are a clamping cover of an integral structure, the clamping cover needs to be sleeved onto the cable body 151 before the cable body 141 is fastened to the network interface plug 142). Then, after being fastened by using the fastener such as the screw, the first clamping cover 1511 and the second clamping cover 1512 are installed into the cover body 152 to form the cable 14 and the cover 15 that are in an assembled state and that are shown in FIG. 17. Finally, the cable 14 and the cover 15 that are assembled and that are shown in FIG. 17 are transported to an installation site of a gateway device. During specific installation, referring to FIG. 18, the network interface plug 142 is plugged into the corresponding network interface 111 in the base 11, and the first limiting structure 144 is abutted against the second limiting structure 112 in the base 11 for limiting; the cover 15 is moved along the cable body 141 to cover the network interface and the cover 15 is buckled to the base 11 by using the buckle, and in this case, the sealing member 143 is attached to the gap between the first clamping cover and the second clamping cover through interference fit, to provide a waterproof function for the cable 14; and then, the cover 15 is fastened to the base 11 by using the screw. This completes installation of the cable 14 of the gateway device.

In the foregoing installation process, referring to FIG. 18, the first limiting structure 144 is abutted against the second limiting structure 112, so that in an installation process of the cover 15, a hard support function can be provided for the cover 15 to squeeze the sealing member 143 (conical flexible rubber), to facilitate installation of the cover 15. The installation process is relatively simple, and effective waterproof for the cable 14 can be implemented through interference fit between the conical flexible rubber and the gap between the first clamping cover and the second clamping cover. When the gateway device needs to be maintained, the screw for fastening the cover 15 may be directly loosened through rotating, and the cover 15 may be directly removed, to implement plugging/unplugging of the network interface plug 142, thereby facilitating maintenance of the gateway device. In addition, in this technical solution, the cable waterproof structure formed between the sealing member 143 (conical flexible rubber) and the waterproof gasket is relatively simple, and has relatively low costs; and the waterproof structure has a relatively small size, so that an appearance effect of the gateway device can be relatively good.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A gateway device, wherein the gateway device comprises a base and a cable waterproof structure disposed on the base, the base comprises at least one network interface, and the cable waterproof structure comprises a cable plugged into the at least one network interface and a cover that covers the network interface;
   the cable comprises a cable body and a network interface plug fastened to an end portion of the cable body;
   a sealing member is disposed at a joint between the cable body and the network interface plug;
   a threading hole through which the cable is threaded is disposed in the cover, and the sealing member is attached to the threading hole through interference fit; and
   wherein the sealing member is a hard sealing member, a flexible sealing layer is disposed on a hole wall of the threading hole, and the hard sealing member fits with the flexible sealing layer.

2. The gateway device according to claim 1, wherein the sealing member is connected to end surfaces of the cable body and the network interface plug through fastening.

3. The gateway device according to claim 1, wherein a cross-sectional area of an end that is of the sealing member and that is close to the network interface plug is greater than a cross-sectional area of an end that is of the sealing member and that is far away from the network interface plug.

4. The gateway device according to claim 1, wherein the cover comprises a cover body, and a first hard structure gasket, a flexible structure gasket, and a second hard structure gasket that are sequentially disposed in the cover body, an accommodating groove is disposed in the cover body, the first hard structure gasket, the flexible structure gasket, and the second hard structure gasket are accommodated in the accommodating groove, and the threading hole is a through hole that penetrates through the first hard structure gasket, the flexible structure gasket, the second hard structure gasket, and the cover body.

5. The gateway device according to claim 2, wherein the cover comprises a cover body, and a first hard structure gasket, a flexible structure gasket, and a second hard structure gasket that are sequentially disposed in the cover body, an accommodating groove is disposed in the cover body, the first hard structure gasket, the flexible structure gasket, and the second hard structure gasket are accommodated in the accommodating groove, and the threading hole is a through hole that penetrates through the first hard structure gasket, the flexible structure gasket, the second hard structure gasket, and the cover body.

6. The gateway device according to claim 4, wherein the sealing member is a hard sealing member, and the hard sealing member is attached to the flexible structure gasket through interference fit.

7. The gateway device according to claim 6, wherein a half slot is disposed in the flexible structure gasket, a side rib is disposed around the flexible structure gasket, and the side rib squeezes a groove wall of the accommodating groove through mutual fitting, to close the half slot.

8. The gateway device according to claim 1, wherein the cover comprises a cover body, a first clamping cover and a second clamping cover that are clamped onto the cable body, the threading hole is disposed in the cover body, an accommodating groove is disposed in the cover body, and the first clamping cover and the second clamping cover are accommodated in the accommodating groove after being aligned and combined with each other.

9. The gateway device according to claim 8, wherein a waterproof gasket is disposed on a side that is of the first clamping cover and that fits with the cable.

10. The gateway device according to claim 9, wherein a waterproof gasket is disposed on a side that is of the second clamping cover and that fits with the cable.

11. The gateway device according to claim 9, wherein the sealing member is a flexible sealing member, and the sealing member is attached to the waterproof gasket through interference fit.

12. The gateway device according to claim 1, wherein a first limiting structure is disposed on the network interface plug, a second limiting structure is disposed in the network interface, and the first limiting structure is abutted against the second limiting structure for limiting, to limit axial movement of the network interface plug toward the inside of the network interface.

13. The gateway device according to claim 1, wherein a buckle is disposed on the cover, a buckling port is disposed on the base, and the buckle is buckled to the buckling port through matching.

14. The gateway device according to claim 1, wherein a cross-section of the cable body is rectangular or circular.

15. The gateway device according to claim 4, wherein a cross-section of the cable body is rectangular or circular.

16. A gateway device, comprising a base and a cable waterproof structure disposed on the base, wherein the base comprises at least one network interface, the cable waterproof structure comprises a cable plugged into the network interface and a cover that covers the at least one network interface, and the cover is fastened to the base by using a fastener;
   the cable comprises a cable body and a network interface plug fastened to an end portion of the cable body;
   conical flexible rubber is formed at a joint between the cable body and the network interface plug through injection molding;
   the cover comprises a cover body, and a first clamping cover and a second clamping cover that are clamped onto the cable body, a threading hole is disposed in the cover body, an accommodating groove is disposed in the cover body, flexible waterproof rubber gaskets are disposed on both a side that is of the first clamping cover and that fits with the cable and a side that is of the second clamping cover and that fits with the cable, the first clamping cover and the second clamping cover are accommodated in the accommodating groove after being fastened by using a fastener, and the flexible sealing member is attached to the threading hole through interference fit; and
   a first limiting structure is disposed on the network interface plug, a second limiting structure is disposed in the network interface, and the first limiting structure is abutted against the second limiting structure for limiting, to limit axial movement of the network interface plug toward the inside of the network interface.

17. The gateway device according to claim 16, wherein a first limiting structure is disposed on the network interface plug, a second limiting structure is disposed in the network interface, and the first limiting structure is abutted against the second limiting structure for limiting, to limit axial movement of the network interface plug toward the inside of the network interface.

18. The gateway device according to claim 16, wherein a buckle is disposed on the cover, a buckling port is disposed on the base, and the buckle is buckled to the buckling port through matching.

19. The gateway device according to claim 16, wherein a cross-section of the cable body is rectangular.

\* \* \* \* \*